United States Patent
Lapointe (10) Patent No.: US 7,889,786 B2
(45) Date of Patent: Feb. 15, 2011

(54) OPERATING FREQUENCY REDUCTION FOR TRANSVERSAL FIR FILTER

(75) Inventor: Marcel Lapointe, Gatineau (CA)

(73) Assignee: Diablo Technologies Inc., Gatineau, Quebec (CA)

( * ) Notice: Subject to any disclaimer, the term of this patent is extended or adjusted under 35 U.S.C. 154(b) by 846 days.

(21) Appl. No.: 10/569,825

(22) PCT Filed: Aug. 27, 2004

(86) PCT No.: PCT/CA2004/001571

§ 371 (c)(1),
(2), (4) Date: Feb. 1, 2007

(87) PCT Pub. No.: WO2005/022745

PCT Pub. Date: Mar. 10, 2005

(65) Prior Publication Data

US 2007/0147559 A1    Jun. 28, 2007

(51) Int. Cl.
*H04L 27/01* (2006.01)
(52) U.S. Cl. .................................... 375/232; 375/350
(58) Field of Classification Search ......... 375/229–236, 375/350
See application file for complete search history.

(56) References Cited

U.S. PATENT DOCUMENTS

| 5,005,185 A | * | 4/1991 | Mizoguchi et al. | 375/235 |
| 5,452,324 A | * | 9/1995 | Lewis et al. | 375/373 |
| 6,138,132 A | * | 10/2000 | Lee et al. | 708/313 |
| 6,590,933 B1 | * | 7/2003 | Shusterman et al. | 375/233 |

* cited by examiner

*Primary Examiner*—Shuwang Liu
*Assistant Examiner*—David Huang (57) ABSTRACT

A method and system for reducing the frequency of operation for a transversal Finite Impulse Response (FIR) filter is disclosed. In the preferred embodiment, the transversal filter operates in such a way that it has an even and odd row of data, which are latched on rising and falling edges of the clock respectively. This allows the clock frequency to be reduced by a factor of 2, and thus allows the use of more power efficient latches. A reduction in the frequency of operation causes the high speed latches within the transversal filter to hold the data bits twice as long as is required, which changes the desired impulse response of the FIR filter. A circuit is required to select the appropriate data bits from the output of the appropriate half-speed latch, and subsequently scale it to apply the co-efficient gain. Each of the subsystems is analog, and operates in accordance with a synchronous clock system. In a more general embodiment of the invention, the data is provided to Q shift registers that operate at a clock rate which is reduced by a factor of Q.

5 Claims, 9 Drawing Sheets

OPERATING FREQUENCY REDUCTION FOR TRANSVERSAL FIR FILTER

BACKGROUND OF THE INVENTION

1. Field of the Invention

The present invention relates generally to computer network communications and more particularly to methods and systems that allow analog transversal FIR filters to operate at ultra high frequencies. More particularly, the present invention relates to a method and a system that allows the use of double-edge clocking to reduce the frequency of operation of a transversal FIR filter whose general functionality can be used to implement a Feed Forward Equalizer (FFE) and a Decision Feedback Equalizer (DFE). The invention is particularly relevant for systems that operate at 10 Gb/s or above, where the reduction in operating frequency of a sub-block will result in reduced power consumption.

2. Description of Related Art

A standard transversal FIR filter includes a set of latches, a set of respective multiplication elements, and a summing node. The order of the filter defines that number of latches contained in the data FIFO, where each latch output can be used to drive a co-efficient value/gain required for the FIR filter functionality to be realized.

The latches of the transversal filter all operate using the same clock, referred to as the High Speed Clock, which has a period T which is equal to the Unit Interval (UI) of the serial data stream. In practical applications, the delay element is implemented using a Flip-Flop that samples data present on an input on a given clock edge, and holds the data value on an output for the duration of a clock period.

In certain cases, it is advantageous to reduce the operating frequency of the clock signal for reasons of technical feasibility or power consumption optimization. It is possible to split the delay elements in the transversal filter into two groups, one of which latches data on the rising edge of the clock signal, the other latching data on the falling edge of the clock signal. This will allow a High Speed clock signal with a period T which is effectively twice the duration of a UI, it also implies that the data sample is held by the delay element for two UI.

In order to improve Bit Error Rate performance in communications systems, a transversal FIR filter is sometimes used in the receiver or the transmitter to correct for InterSymbol Interference (ISI). An FFE is commonly used in a transmitter, while a receiver will generally contain a DFE.

An FFE is an extension of a standard serializer transmit block, where data bits are shifted through delay elements to be transmitted one at a time, but with a partial contribution from other bits contained in the delay structure. An FFE serial transmitter includes a set of delay elements, a set of multipliers, and a summing node. The delay elements all operate using the same High Speed clock signal, and shift data forward on only one edge (usually rising) of the clock. An FFE requires that the output of a delay element be held for no more than one UI. Thus, the period T of the High Speed clock is generally equal to one UI for proper functionality.

A DFE receiver block is an extension of a standard serial bit receiver block. A DFE receiver block includes a slicer, a set of delay elements, a set of multipliers, and a summing node. The slicer and delay elements all operate using the same High Speed clock signal, and sample data on only one edge (usually rising) of the clock. A DFE requires that the data sample be held at the output of a delay element for not more than one UI. Thus, in order for a DFE receiver block to function correctly, the period T of the High Speed clock signal must be equal to the Unit Interval of the incoming data stream.

In both the case of the FFE and DFE, increasing the High Speed clock period by a factor of two would cause a functional failure. Therefore, there is a need to have an efficient method and system that will allow a DFE to function using a double edge clocking scheme, so that the frequency of operation of the transversal filter in an FFE or DEE can be reduced.

SUMMARY OF INVENTION

The present invention is a method and system for reducing the frequency of operation for a transversal Finite Impulse Response (FIR) filter. The transversal filter operates in such a way that it has an even and odd row of data, which are latched on rising and falling edges of the clock respectively. This allows the clock frequency to be reduced by a factor of 2, and thus allows the use of more power efficient latches. Reducing the frequency of operation causes the high speed latches within the transversal filter to hold the data bits twice as long as is required, and thus a circuit is required to select the appropriate data bits from output of the appropriate half-speed latch, and subsequently scale it to apply the co-efficient gain. Each of the subsystems is analog, and operates in accordance with a synchronous clock system In one particular embodiment, the present invention may be characterized as a method and system to allow a transversal filter to operate at a reduced frequency while maintaining the Finite Impulse Response that is required by the application. This is achieved by providing latches that operate at a slower sub-multiple of the high speed clock and multiplexing the output of the slower latches in such a way that the co-efficient multipliers are driven by the correct data, and for the correct duration. Advantageously, the reductions in frequency for the transversal filter result in a high-speed circuit that may have considerably lower power consumption than one that operates at full speed. Additionally, the multiplexing circuit may directly apply the discreet gain required to create a coefficient, which by construction will further reduce complexity, die area, and power consumption.

DETAILED DESCRIPTION OF THE INVENTION

The present invention provides a method and a system for using a double-edge clocking scheme and reducing the frequency of operation for a transversal FIR filter. The invention comprises of a set of 2:1 multiplexers, whose output amplitude can be controlled such that it is possible to apply a gain to the selected input signal. The invention is used in combination with a transversal FIR filter that operates at one half the intended data rate. The transversal filter is comprised of 2 separate sets of analog latches, where one set is positive edge active and the other set is negative edge active.

The present invention can be used to implement very high-speed transversal FIR filters where the frequency requirements may be at the very limit of some mainstream CMOS technologies and geometries. Since the frequency of operation for the latches may be reduced by a factor of 2, the overall current consumption can also be reduced, and thus an overall reduction in power consumption can be realized through the use of the present invention.

In order to appreciate the advantages of the present invention, it will be beneficial to describe the invention in the context of an exemplary 10 Gb/s Serializer/Deserializer (SerDes). The particular implementation chosen is depicted in FIG. 1, which is a simplified block diagram of a single pair communication system operating in half duplex move over 2 pair differential copper backplane traces.

Figure 1:
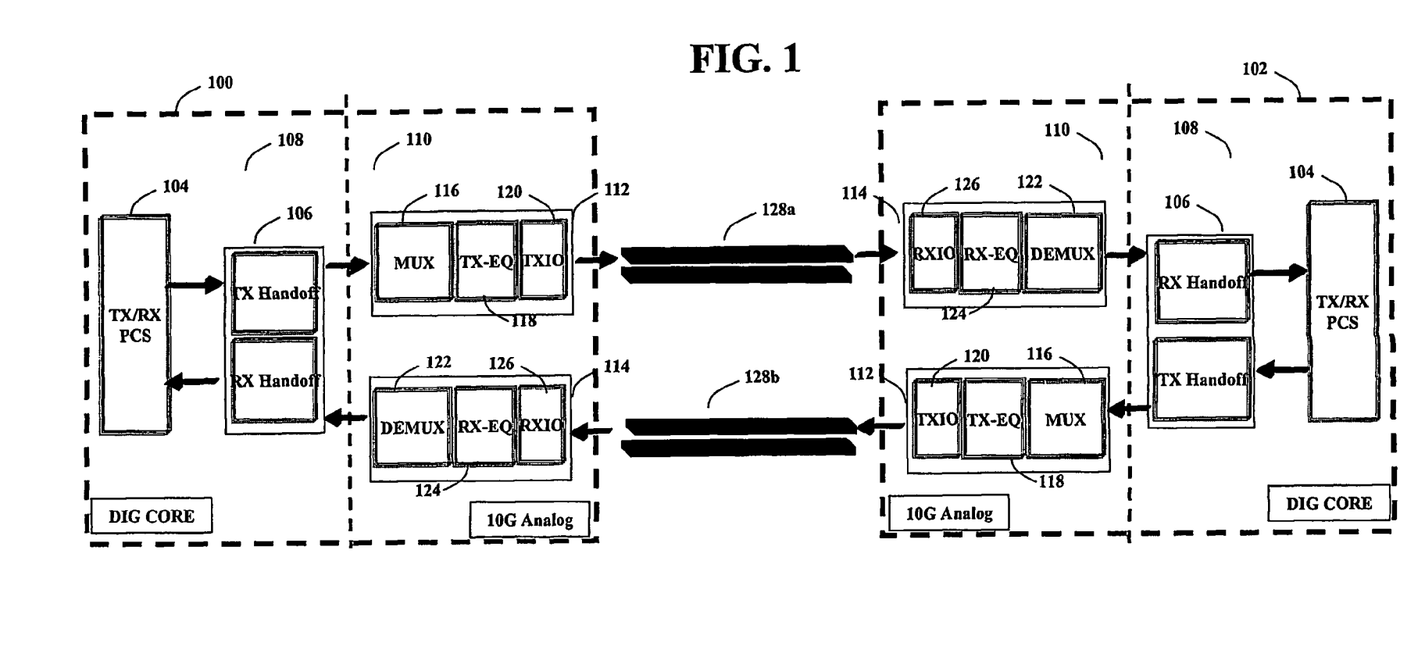
FIG. 1 a simplified block diagram of a point-to-point backplane communication.

In FIG. 1 the communication system is represented as a point-to-point system in order to simplify the explanation, and includes two main SerDes blocks 100 and 102, coupled together via two pairs of differential high-speed copper traces 128a and 128b. Each transceiver block 100 and 102 is capable of operating at a baud rate exceeding 10 Gb/s in each direction. Each transceiver 100 and 102 has a high-speed analog interface 110 and a low-speed digital subsection 108. A phase matching handoff 106 guarantees timing between the digital interface and analog interface.

In the case of data transmission, the TX parallel data is encoded in the PCS block 104 and is fed into the MUX 116 at an appropriately scaled lower frequency clock. Timing between the digital and analog interfaces is guaranteed by the handoff 106. Encoded data is multiplexed from a parallel format into a high-speed serial format at data rates exceeding 10 Gb/s by the MUX block 116. Transmit data is equalized by the TX_EQ. 118 and subsequently transmitted into the channel 128 by an impedance matched analog TX_IO block 120.

In the case of data reception, RX_IO 126 provides an impedance-matched buffer between the channel 128 and the input of the RX_EQ 124. RX_EQ corrects the attenuation and jitter introduced by the channel. A serial bit stream representing latch decisions of the equalized data is then fed into the DEMUX 122, which in turn will de-serialize the data into a parallel output word. The parallel data output of the DEMUX 122 feeds the PCS block 104 through the handoff 106. The handoff also serves to retime the data and filter jitter introduced by the channel 128b. The PCS block decodes the parallel data stream to reproduce the original transmitted parallel data stream.

Figure 2:
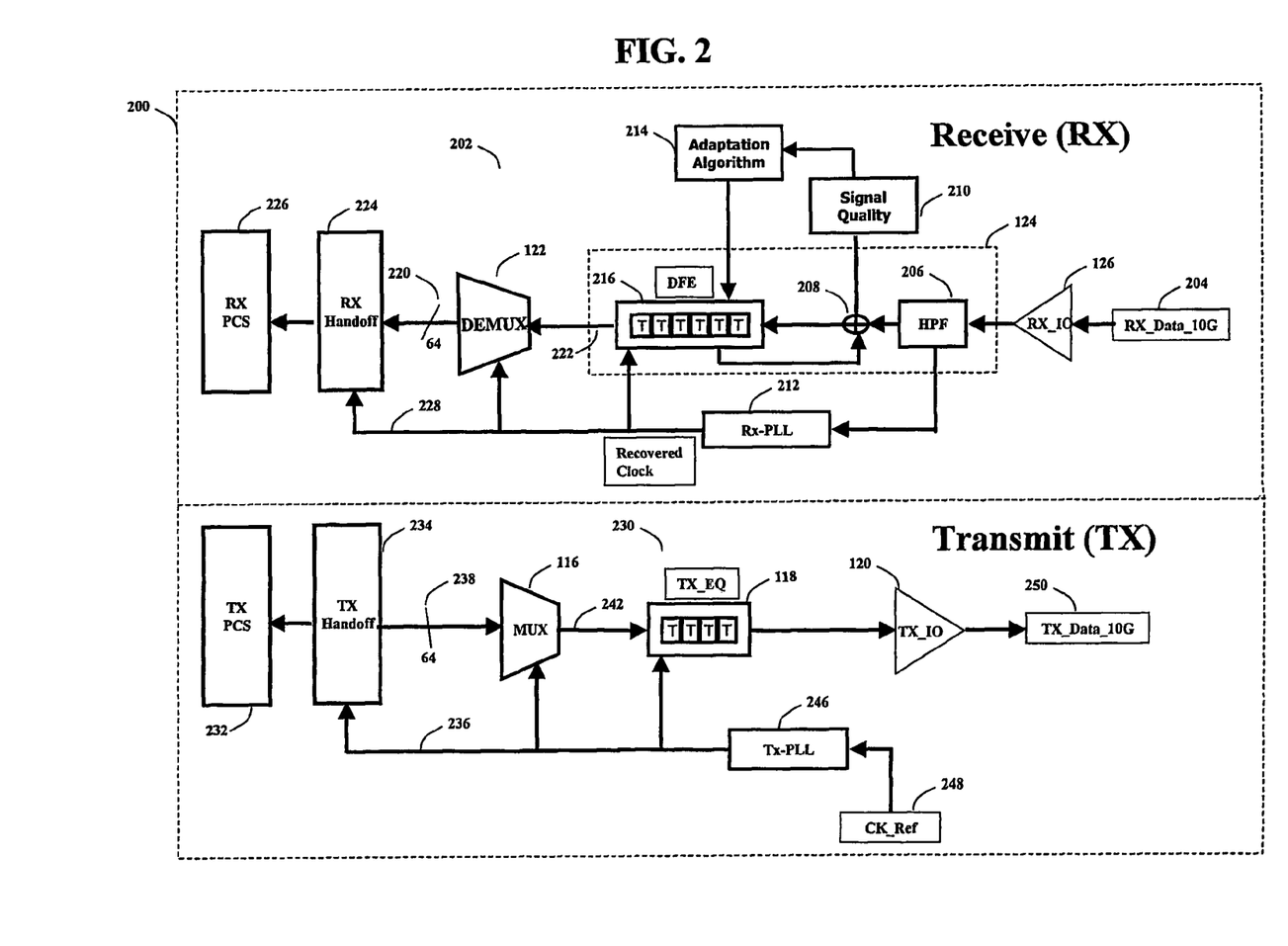
FIG. 2 a simplified block diagram of a functional architecture and internal constructions of an exemplary 10 Gb/s SerDes which is outlined in FIG. 1.

FIG. 2 is a simplified block diagram of the functional architecture and internal constructions of an exemplary 10 Gb/s SerDes 200, such as that was described in FIG. 1. The illustrative 10 Gb/s SerDes, which includes the Receive (RX) and Transmit (TX) paths 202 and 230 respectively, will be referred to as the "SerDes".

The SerDes RX path includes an incoming serial data stream 204, RX_IO 126, High Pass Filter (HPF) 206, Summing Node 208, Decision Feedback Equalizer (DFE) 216, Receive PLL (RXPLL) 212, DEMUX 122, RX Handoff 224, and the RX PCS 226. The HPF 206 serves to pre-shape the spectral content of the signal in such a way that data bit transitions are accentuated, which serves to partially equalize the incoming data stream so that the RXPLL 212 can use it for clock recovery. The recovered clock signal on 228 is phase and frequency correlated with the incoming serial data stream 204 and is used by the DFE 216, DEMUX 122, and the Handoff 224. The Handoff 224 serves to absorb low frequency jitter and guarantees that the RX_PCS 226 receives the data without any timing violations.

Based on the signal quality criteria determined by specialized analog circuitry 210, an adaptation algorithm 214 drives the co-efficient settings of the analog DFE 216. Since the DFE is based on a feedback mechanism, the perfectly equalized data stream is formed at the summing node 208, where the feedback response of the DFE 216 and the feedforward response of the HPF 206 are linearly added to form the totally equalized data stream. The DFE contains a transversal filter, which is essentially a shift register. The output data stream of the DFE 222 represents logical decisions made from the equalized data stream 208. The depth of the DFE 216 governs the latency of the data stream with respect to the input of the channel. The DEMUX 122 contains multiple stages of 2:1 demultiplexers, which will serve to generate a lower speed parallel data bus 220 that will be processed by the RX_PCS.

The SerDes TX path includes the TX_PCS 232, TX Handoff 234, MUX 116, TX Equalizer (TX_EQ) 118, TX_PLL 246, TX_IO 120, and output data stream 250. Using a reference clock 248, the TX_PLL 246 generates jitter free high-speed clocks that will drive the TX Handoff 234, MUX 116, and TX_EQ 118. The MUX contains a series of 2:1 multiplexers and is designed to transform a parallel data stream 238 into a high-speed serial bit stream 242. A TX_EQ 118 uses the outgoing serial bit stream 242 to generate the pre-shaped bit stream 250 that is launched into the data channel via the output 10 buffer 120. Transmit equalization is often used to complement or enhance receiver-based equalization because of its ease of implementation and straightforward operation.

The TX_EQ 118 and DFE 216 are both discrete time equalizers that require a clock. The minimum required frequency of operation of the filters is the data rate frequency. Therefore, a 10 Gb/s data stream would require the equalizers to be clocked with a 10 Ghz clock, assuming the circuit is active on a single rising or falling edge of said clock. Equivalently, the period T of the clock would need to be the same as the duration of a single data bit, where this duration is generally referred to as a Unit Interval (UI). For 10 Gb/s operation, the UI is 100 ps.

Figure 3A:
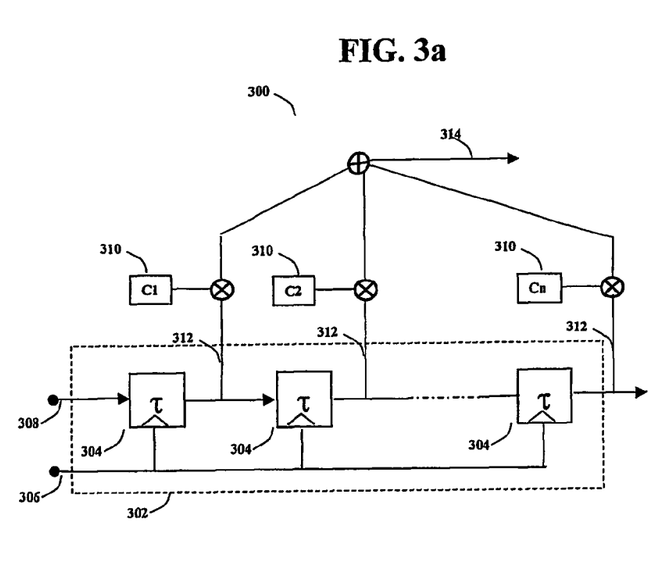
FIG. 3a a simplified block diagram of a transversal FIR filter using single edge clocking.

FIG. 3a shows a simplified block diagram of a transversal FIR filter using single edge clocking. A transversal FIR filter 300 includes shift register 302, which has delay elements 304 serially connected to the data signal on line 308. The delay elements are switched by a clock signal on line 306 at a switching rate that is equal to the bit rate. The delay $\tau$ is equal to the bit-rate. This interval can also be expressed as the period T of the clock signal appearing on line 306. The output of each delay element 304 can then be used to drive a coefficient value 310 to generate the FIR filter response 314. In the context of a 10 Gb/s SerDes, generation of a 10 Ghz clock and design of logic that can operate correctly within 100 ps is very challenging in contemporary CMOS technology, and there would be great advantages in performance and power consumption if the circuitry could operate at a lower frequency.

Power consumption and design complexity of the FIR filter may be reduced if the frequency of operation of the filter is reduced by a factor Q. If the clock frequency of the filter 300 is reduced by a factor Q where $$Q=2^P, \text{ where } p: \{0,1,2,3\ldots\},\qquad \text{eq. 1}$$

And where p is an integer.

Figure 3B:
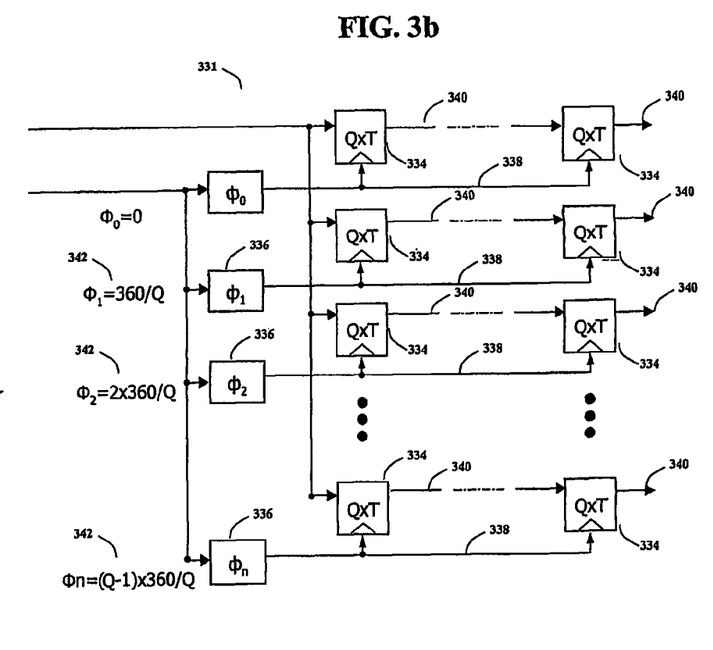
FIG. 3b a simplified block diagram of an embodiment of a shift register matrix 331 constructed in accordance with the principles of the invention.

FIG. 3b is a simplified block diagram of an embodiment of a shift register matrix 331 constructed in accordance with the principles of the invention. The shift register matrix has a matrix of delay elements 334 the arrangement and operation of which is as follows. The data signal on line 330 is provided to Q first delay elements 334 arranged as the Q rows of delay elements 334 in the first or left most column of the matrix of delay elements. In this arrangement, the delay of each delay element is Q×τ, where, again, τ is equal to the bit-rate. This interval can also be expressed as a multiple Q of the period T of the data clock signal of the data signal appearing on line 330. Thus the delay elements 334 operate at a reduced frequency from those in the configuration of FIG. 3a for a data rate on lines 308 and 330 that is equal. The clock signal on line 332 has a period Q×T of the reference data rate or data clock signal. Expressed another way, the clock signal on line 332 has a frequency that is a Q sub-multiple of the data clock signal, thus the frequency of the clock on line 332 is 1/Q of the frequency of the reference data rate.

Thus in the implementation of FIG. 3b, reduced power consumption is achieved as the frequency of operation of the filter is reduced by a factor Q from the reference data rate.

The shift register matrix of FIG. 3b is configured to shift data correctly without dropping any bits. This is achieved by using latches 334 that operate on Q equally spaced phases of the clock signal appearing on line 332, such that the data 330 is captured every UI. Phase delay blocks 336, whose phase delay contribution is defined by the relationship Eq. 2, generate the clock signaling appearing on lines 338.

$$\phi_n = n \times \frac{360}{Q}, \text{ where } n: \{0, 1 \ldots Q-1\}\qquad \text{eq. 2}$$

The delay of the latches 334 is increased by a factor of Q, so that the overall timing of the system is preserved. This system has the advantage of operating using a latch 334 that is Q times slower than the latch 304 in FIG. 3a. However, where a shift register matrix 331 is used to implement an FIR filter, the response of the filter would be incorrect regardless of the coefficient settings. The change in the duration of the latched data signal passing along line 340 will prevent a filter constructed using the shift register matrix of FIG. 3b from generating a response at the frequency of interest. An additional circuit is required to allow the shift register matrix 331 to be used as part of a transversal FIR filter.

Figure 4:
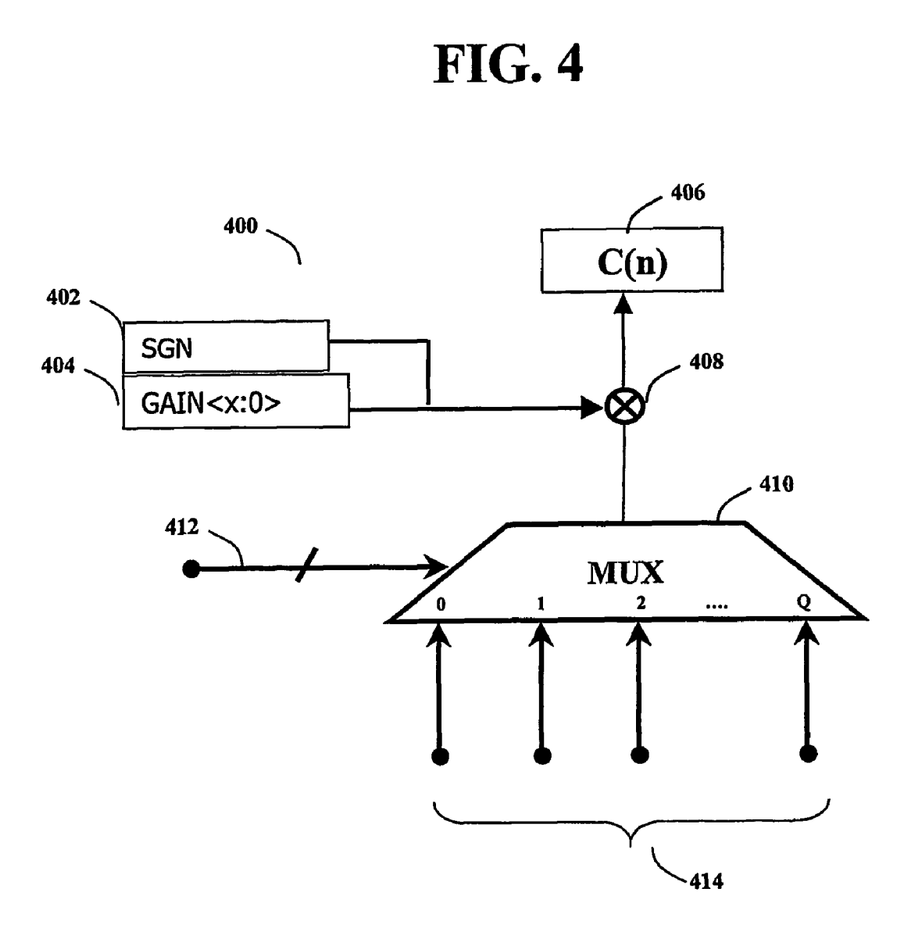
FIG. 4 a simplified block diagram of the present invention.

FIG. 4 is a detailed block level diagram of a multiplexer multiplier (mux/mul) 400 constructed in accordance with the principles of the invention. A multiplexer 410 with Q inputs 414 has an input select control 412 that selects an output to summer 408 from one of the inputs 414. When the mux/mul 400 is configured with a shift register matrix 331 of FIG. 3b, the selected input line of the Q inputs 414 is multiplexed at the same frequency or clock rate as the serial data signal appearing on line 330. That is, the multiplexer 410 is required to continuously select from Q inputs 414 for duration of 1UI. The output of the Multiplexer 410 accommodates a scaling factor related to a gain 404 and a polarity according to a sign 402. This combination of functionality is referred to as a multiplexer-multiplier (Mux-Mul) 400.

Modifying the selected input value with respect to polarity and gain produces the same effect as a coefficient multiplier. If the maximum signal swing is normalized with the desired signal amplitude, then it is possible to scale the output of the mux-mul as a function of control inputs 404 and 402. By construction, this mechanism can be related directly to a coefficient used in an FIR filter. The coefficient value is given by:

$$C(n)=D[n] \times G[x:0] \times \text{sgn}(G)\qquad \text{eq. 3}$$

where C(n) 406 represents the applied response related to the nth coefficient of a given transversal filter, D[n] represents any one input decision data 414, G[x:o] represents the normalized magnitude 404 of the gain associated with the coefficient, and sgn(G) represents the sign 402 of the gain which is applied. It should be noted that only the input select 412 is changing at the same rate as the input data stream, and this allows the Mux-Mul to simulate the effect of a baud-spaced transversal filter for each coefficient.

Q Mux-Mul's are required for every stage of a transversal filter, which means that every stage of the transversal filter will represent Q number of coefficients. Further references to the Mux-Mul structure and transversal filters will be based on Q=2, even though it is understood that Q can be any power of two as per Eq. 1. When Q=2, the phase delay $\phi_2$ 336 is 180 degrees, which corresponds to the complement of the filter clock. In the exemplary 10 Gb/s SerDes, a single clock phase is used throughout the circuit to further decrease complexity. Decision logic is designed to be active on the falling edge of the clock in order to implement the section of the transversal filter operating on the phase delayed clock 338.

Figure 5:
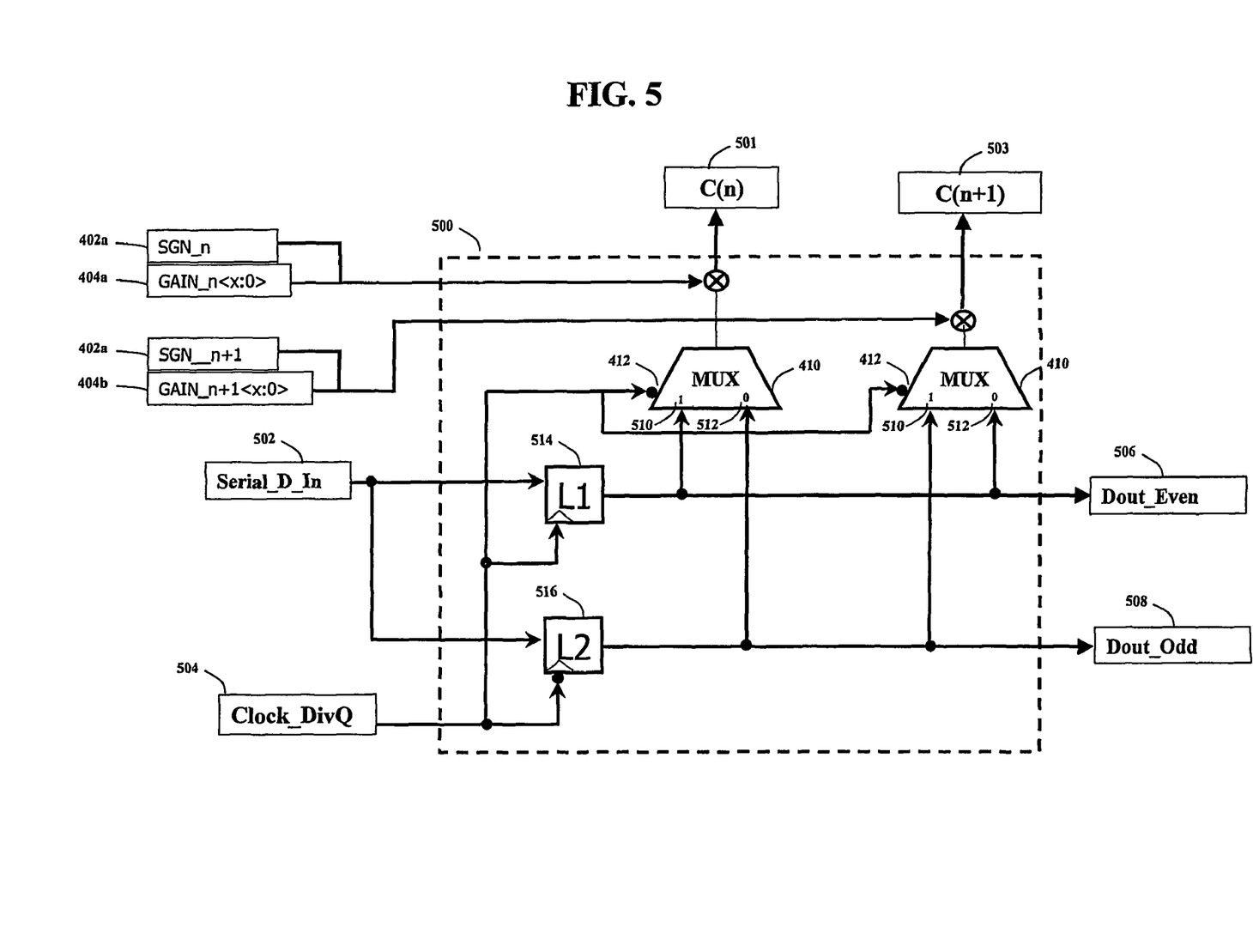
FIG. 5 a simplified block diagram of a transversal FIR filter stage that incorporates the present invention.

FIG. 5 is a detailed block diagram of the first stage 500 of a transversal filter that uses the present invention 400 in the context of the exemplary 10 Gb/s SerDes. There is a 10 Gb/s serial input data stream 502, 5 Ghz clock input 504, coefficient control signals 402 and 404, coefficient outputs 501 and 503, and latched data outputs 506 and 508 that are the even and odd decisions of the latches 514 and 516. Rising-edge active latch 514 and falling-edge active latch 516 have a delay time of 200 ps. The Mux-Mul's 412 have two data inputs 510 and 512, and an input select 412. Since Q=2, there are two coefficients 501 and 503 that are generated by the stage. The even and odd decision data 506 and 508 are held for 200 ps and will be used by the next stage in the filter. The 5 Ghz clock 502 is used as a logical input select 412 for each Mux-Mul, where one input 510 or 512 is selected in alternating fashion for 1UI.

Figure 8:
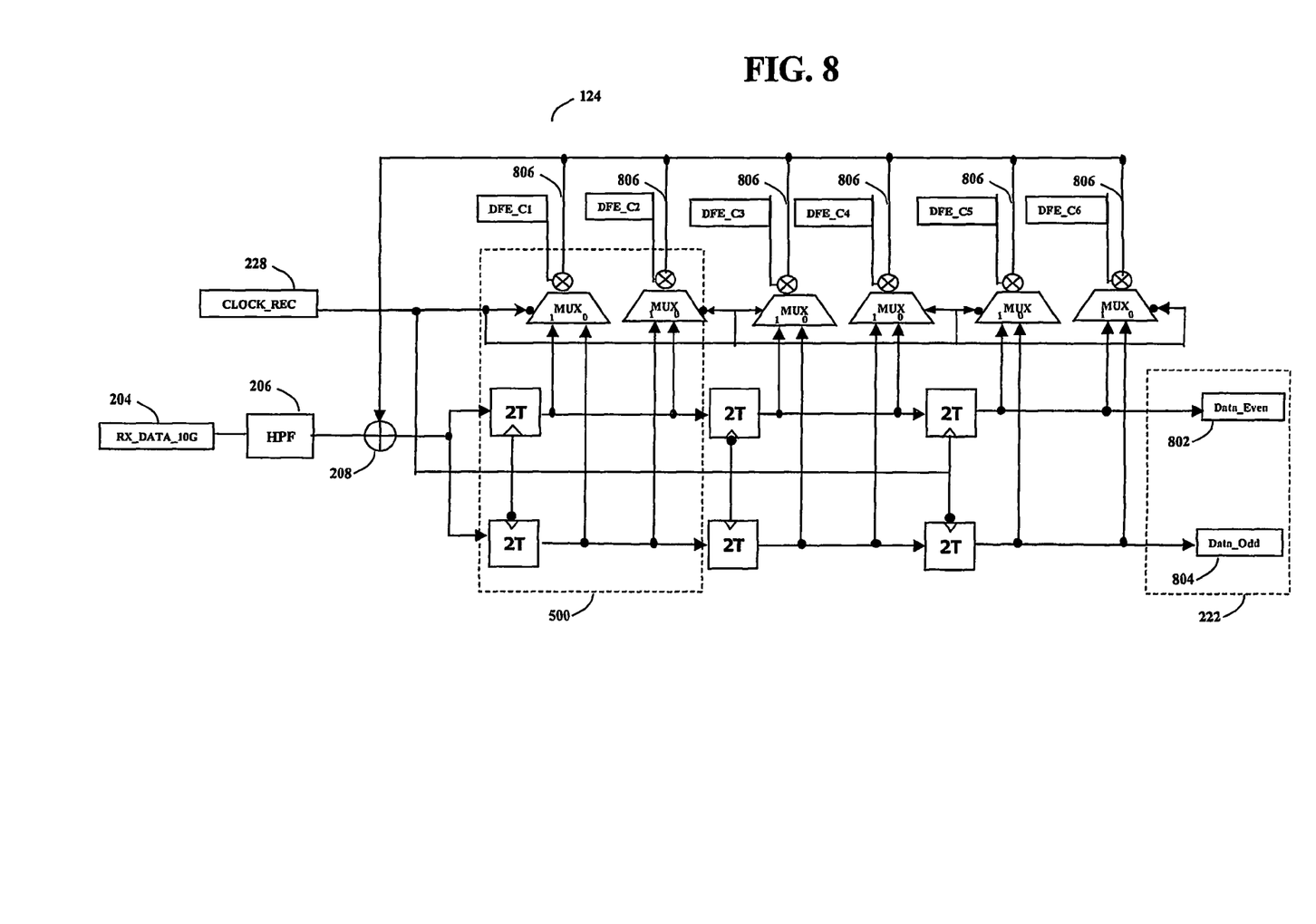
FIG. 8 a simplified block diagram of an exemplary DFE that incorporates the present invention.

In the case where analog latches are used to build the transversal filter, as opposed to true digital Flip-Flops, the outputs of the even latches are connected to the inputs of the odd latches and vice versa. This has to do with the fact that latches, unlike Flip-Flops, have a tracking stage that starts when the clock is low, and a regeneration stage that starts when the clock is high. If a series of identical latches were cascaded to form a shift register, all the latches would enter either tracking or regeneration mode at the same time, which would cause the circuit to fail. By alternating active high and active low latches in series, a following latch will track what the previous latch has regenerated, and thus the data can properly move through the shift structure. The overall functionality of the transversal filter is not changed, and this point is specifically related to the implementation of the circuit, not the principal of the present invention. FIG. 8a and FIG. 8b illustrate this interconnect scheme clearly.

Figure 6:
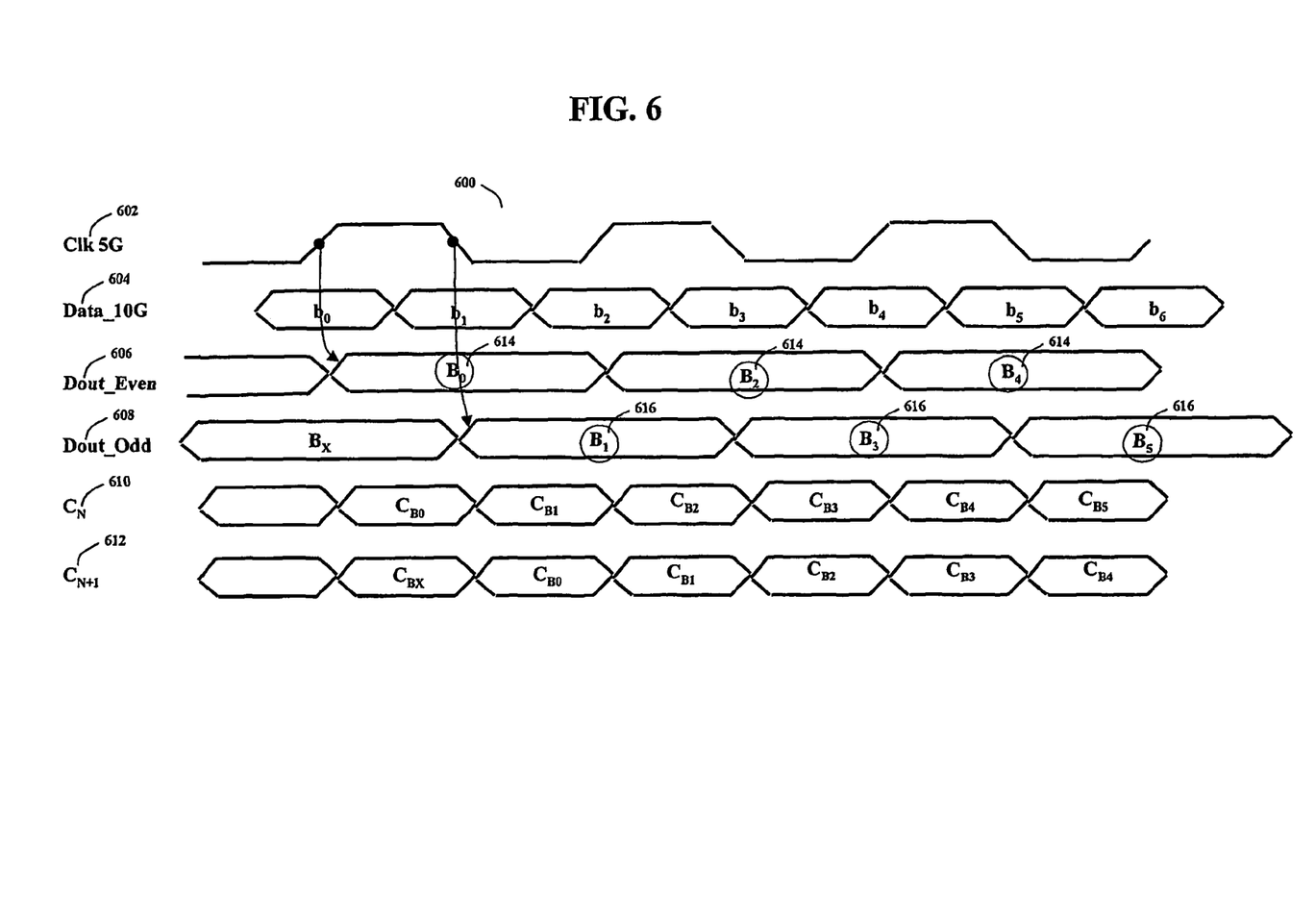
FIG. 6 a simplified timing diagram for the first stage of a transversal filter using the present invention.
Figure 7:
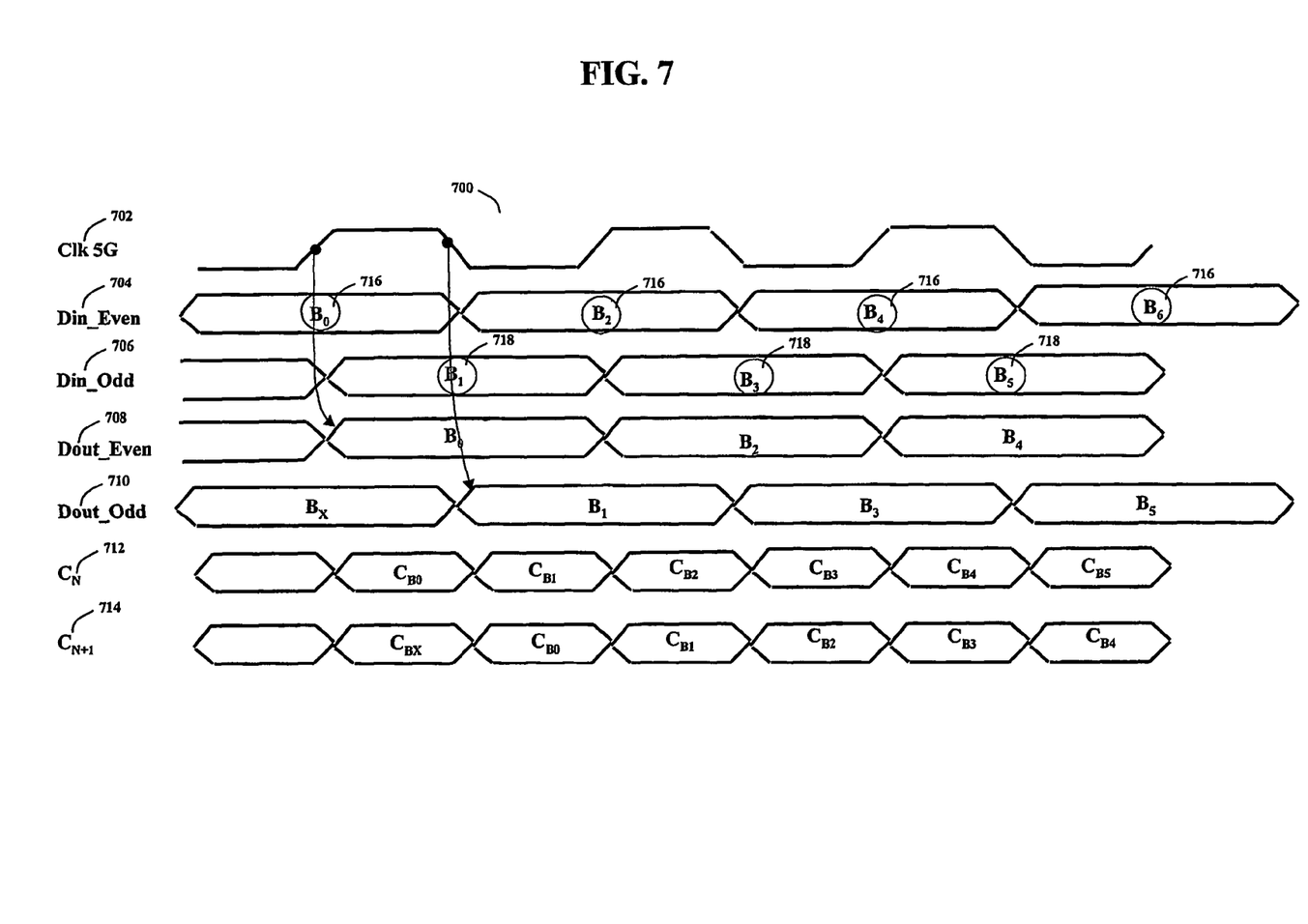
FIG. 7 a simplified timing diagram for a generic stage of a transversal filter that incorporates the present invention.

FIG. 6 is a timing diagram 600 related to the first slice of the FIR filter. The incoming data signal 504 is a serial bit stream, with a data period of 1UI. The clock signal 602 has a period of 2UI. The decision data signal 614 for the even latch 514 has a UI advance on the decision data signal 616 of the odd latch 516. The lowercase notation bX denotes the incoming serial data stream with duration 1UI, and the uppercase notation BX denotes the corresponding decision data with duration 2UI. The overall effect of the present invention can be seen in the coefficient outputs signals 610 and 612. There are two output signals 610 and 612 with duration 1UI that respect Eq. 3 and produce the desired coefficient response required for the FIR filter application. FIG. 7 is a similar timing diagram 700 that is specific to the rest of the slices in the FIR filter, where latches are acting on decisions made by a previous stage in the FIR filter. The decision signals 708 and 710 are delayed versions of the decision signals 704 and 706 from the previous stage of the filter. The data signals 708 and 710 are used to drive a new set of coefficient signals 712 and 714.

The basic structure 500 can be used to build a Feed-Forward transversal FIR filter or a Decision Feedback FIR filter. If the mux-mul coefficient outputs are summed for every stage and used as a stand-alone response it is considered a Feed-Forward Equalizer (FFE) that would correspond to the TX_EQ 118. If the coefficient outputs for every stage are summed and fed back to the input of the filter it is considered a Decision Feedback Equalizer (DFE) that would correspond with the DFE 216.

FIG. 8 outlines a DFE 124 that is configured to have six coefficients 806 using three stages 500, and which is used in the exemplary 10 Gb/s SerDes Receive path 202. The output coefficient signals 806 are summed and fed back to the input of the first stage, where it is combined with the output of the HPF 206 at the summing node 208. The entire structure is synchronously clocked using the recovered 5 Ghz clock 228. The data outputs 802 and 804 from the last stage of the DFE form the data input 222 to the DEMUX 122. The DEMUX block 122 has one less stage due to the fact that the original serial bit stream was already de-multiplexed by a factor of two by the DFE, hence Data_even 802 and Data_odd 804.

Figure 9:
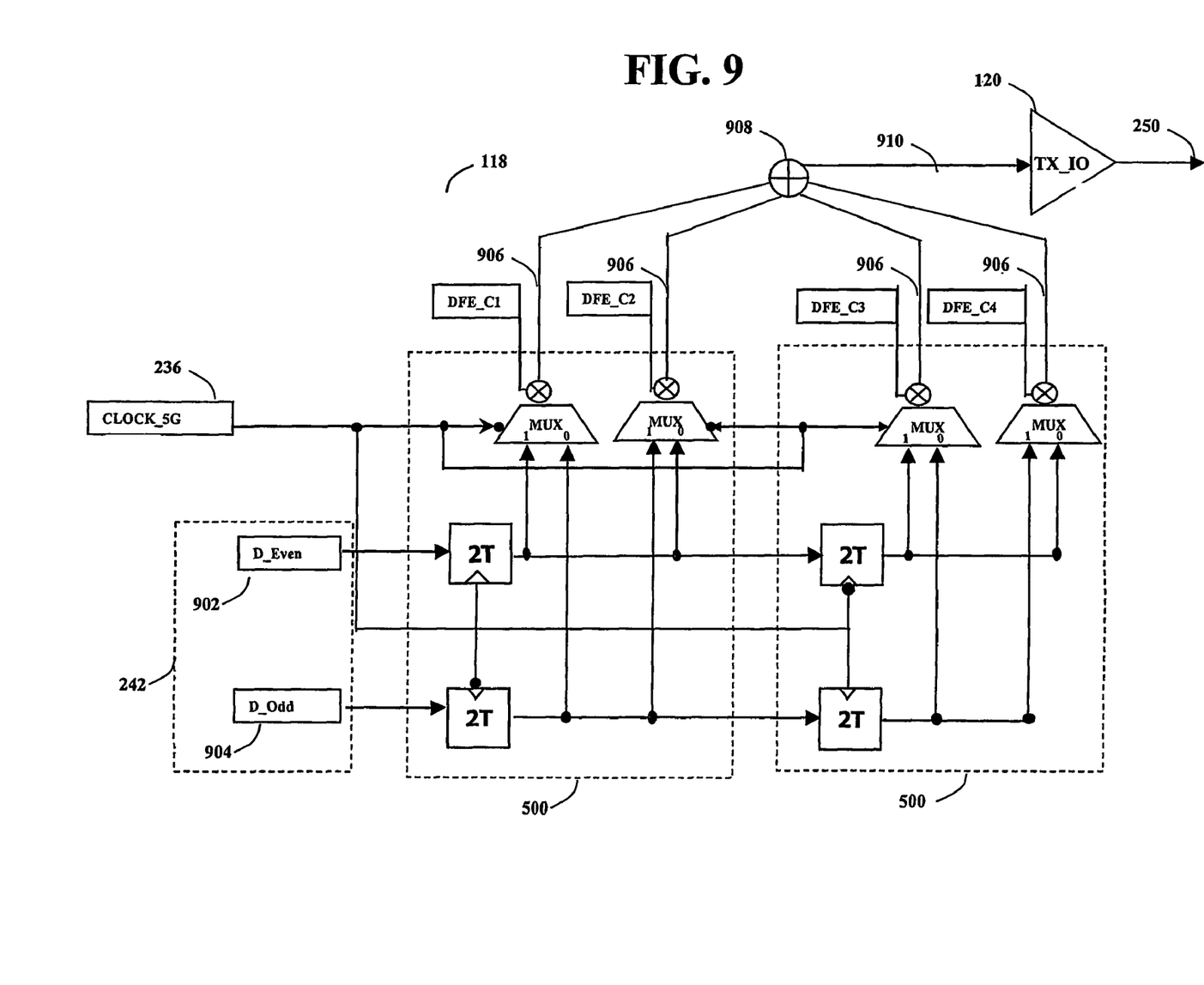
FIG. 9 a simplified block diagram of an exemplary FFE that incorporates the present invention.

FIG. 9 outlines a TX_EQ 118 that is configured to have four coefficients using two stages 500, and which is used in the exemplary 10 Gb/s SerDes Transmit path 230. The output coefficient signals 906 are summed at 908 and fed forward into the TX_IO driver 120. The entire structure is synchronously clocked with the locally generated clock 236. The input data 242 from the MUX 116 requires a final stage of multiplexing. The final stage of the multiplexing is performed by the Mux-Muls within the transversal filter, where D_even 902 and D_odd 904 are multiplexed into a serial response 910.

I claim:

1. Apparatus for use in a reduced clock rate finite impulse response filter comprising:
   i) Q latch means all coupled to an input data signal having a unit interval rate and each latch means providing a latched output signal in response to a latch control signal;
   ii) Q multiplexer/multiplier, mux/mul, meats, each mux/mul means providing one output and Q inputs to receive the latched output signal of a respective latch means;
   iii) selection means for controlling said mux/mul means operative to produce an output signal selected from one of said Q inputs;
   iv) means to produce a clock signal; and
   v) Q phase delay means coupled to said clock signal providing an output latch control signal to a corresponding latch means;
   wherein each phase delay means is adapted to produce a unique output latch control signal that is phase delayed from the clock signal by a phase delay of N×360/Q, where unique values of N correspond to each individual phase delay means and range from 0 to Q−1, wherein Q is an integer greater than 1.

2. The apparatus of claim 1 further including:
   i) signal conditioning means for each mux/mul means to condition the output signal, of the mux/mul means; and
   ii) summing means to sum the conditioned signals of all such signal conditioning means.

3. The apparatus of claim 2, wherein said signal conditioning means is adapted to modify the gain and the sign of the output signal of the corresponding mux/mul means.

4. The apparatus of claim 1, wherein the means to produce a clock signal is adapted to operate to produce a clock signal that is a sub-multiple Q of the unit interval rate of said input data signal.

5. The apparatus of claim 1, wherein the selection means is adapted to operate to select an output signal from one of said Q inputs at a rate corresponding to the unit interval rate of said input data signal.

* * * * *